United States Patent
Xu et al.

(10) Patent No.: US 10,512,186 B2
(45) Date of Patent: Dec. 17, 2019

(54) WIRE BUNCHING DEVICE, BACKLIGHT MODULE AND DISPLAY DEVICE

(71) Applicant: BOE TECHNOLOGY GROUP CO., LTD., Beijing (CN)

(72) Inventors: Jian Xu, Beijing (CN); Yong Qiao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/549,479

(22) PCT Filed: Jan. 24, 2017

(86) PCT No.: PCT/CN2017/072460
§ 371 (c)(1),
(2) Date: Aug. 8, 2017

(87) PCT Pub. No.: WO2017/193642
PCT Pub. Date: Nov. 16, 2017

(65) Prior Publication Data
US 2018/0235097 A1    Aug. 16, 2018

(30) Foreign Application Priority Data
May 13, 2016    (CN) ..................... 2016 2 0437785 U

(51) Int. Cl.
*H05K 7/02*    (2006.01)
*G02F 1/1335*    (2006.01)
(Continued)

(52) U.S. Cl.
CPC ......... *H05K 7/02* (2013.01); *G02F 1/133602* (2013.01); *G02F 1/136286* (2013.01); *H05K 7/1452* (2013.01)

(58) Field of Classification Search
CPC .. H05K 7/02; H05K 7/1452; G02F 1/133602; G02F 1/136286
See application file for complete search history.

(56) References Cited

U.S. PATENT DOCUMENTS 4,439,896 A * 4/1984 Matsui ...................... F16L 3/08
24/16 PB
4,457,482 A * 7/1984 Kitagawa .................. F16L 3/23
248/73
(Continued)

FOREIGN PATENT DOCUMENTS

CN    101782208 A    7/2010
CN    202100836 U    1/2012
(Continued)

OTHER PUBLICATIONS

Search Report and Written Opinion dated May 2, 2017 from State Intellectual Property Office of the P.R. China.

*Primary Examiner* — Hoa C Nguyen
*Assistant Examiner* — Keith DePew
(74) *Attorney, Agent, or Firm* — Dilworth & Barrese, LLP.; Michael J. Musella, Esq.

(57) ABSTRACT

A wire bunching device, a backlight module and a display device are provided. The wire bunching device includes a base and a top cap; the top cap and the base being connected with each other to form a hollow structure running through the wire bunching device in a first direction, the hollow structure being used for a wire material to pass through; an inner wall of the hollow structure at least including a first portion formed by the top cap and a second portion formed by the base, the first portion and the second portion respectively extending from one end of the hollow structure to the other end in the first direction.

16 Claims, 5 Drawing Sheets

(51) Int. Cl.
*G02F 1/1362* (2006.01)
*H05K 7/14* (2006.01)

(56) References Cited

U.S. PATENT DOCUMENTS

| | | | | |
|---|---|---|---|---|
| 4,635,886 A * | 1/1987 | Santucci | ................ | F16L 3/12 |
| | | | | 24/543 |
| 4,669,688 A * | 6/1987 | Itoh | ................ | F16L 3/23 |
| | | | | 24/16 PB |
| 5,739,470 A * | 4/1998 | Takeda | ................ | H02G 3/0487 |
| | | | | 174/101 |
| 6,164,603 A * | 12/2000 | Kawai | ................ | F16L 3/23 |
| | | | | 24/297 |
| 6,525,273 B1 * | 2/2003 | Cunningham | ................ | F16L 3/1215 |
| | | | | 174/135 |
| 6,528,728 B1 * | 3/2003 | Shima | ................ | H02G 3/0437 |
| | | | | 174/101 |
| 6,561,465 B2 * | 5/2003 | Kondo | ................ | F16L 3/1025 |
| | | | | 174/135 |
| 6,861,589 B2 * | 3/2005 | Katsumata | ................ | H02G 3/0487 |
| | | | | 174/101 |
| 7,038,133 B2 * | 5/2006 | Arai | ................ | H02G 3/0418 |
| | | | | 138/115 |
| 7,060,908 B2 * | 6/2006 | Daito | ................ | B60R 16/0215 |
| | | | | 174/135 |
| 7,507,906 B2 * | 3/2009 | Suzuki | ................ | H02G 3/32 |
| | | | | 174/117 F |
| 8,124,887 B2 * | 2/2012 | Suzuki | ................ | B60R 16/0215 |
| | | | | 174/481 |
| 8,561,950 B2 * | 10/2013 | Li | ................ | H02G 3/32 |
| | | | | 248/73 |
| 8,870,131 B2 * | 10/2014 | Gotou | ................ | F16B 21/086 |
| | | | | 174/480 |
| 9,520,702 B2 * | 12/2016 | Sugimoto | ................ | H02G 3/0468 |
| 2005/0126094 A1 * | 6/2005 | Shimizu | ................ | F16L 3/26 |
| | | | | 52/220.1 |
| 2009/0026322 A1 * | 1/2009 | Neumann | ................ | H05K 3/301 |
| | | | | 248/49 |
| 2016/0048059 A1 * | 2/2016 | Zhang | ................ | G02F 1/133608 |
| | | | | 349/61 |
| 2016/0342027 A1 * | 11/2016 | Cao | ................ | G02F 1/133608 |
| 2017/0003546 A1 * | 1/2017 | Eichenlaub | ................ | G02F 1/133606 |

FOREIGN PATENT DOCUMENTS

| | | |
|---|---|---|
| CN | 203895935 U | 10/2014 |
| CN | 203932873 U | 11/2014 |
| CN | 204928004 U | 12/2015 |
| CN | 205691906 U | 11/2016 |
| JP | H076815 A | 1/1995 |

* cited by examiner

WIRE BUNCHING DEVICE, BACKLIGHT MODULE AND DISPLAY DEVICE

TECHNICAL FIELD

The present disclosure relates to a wire bunching device, a backlight module and a display device.

BACKGROUND

In a display device, there are more wires connected between a power board and a signal board provided in a backlight module and a whole machine system, which is prone to cause crosstalk and operator identification confusion. At present, a method for fixing these wires is taking electric wires of a same type in a same wire connecting direction as a group, and attaching the same onto a backplane with an adhesive tape.

SUMMARY

At least one embodiment of the present disclosure relates to a wire bunching device, a backlight module and a display device, which are capable of effectively fixing wires in the backlight module, to prevent occurrence of identification confusion and wire crosstalk.

One aspect of the disclosure provides a wire bunching device, comprising: a base; and a top cap connected with the base to form a hollow structure running through the wire bunching device in a first direction; wherein the hollow structure is used for a wire material to pass through, an inner wall of the hollow structure at least comprises a first portion formed by the top cap and a second portion formed by the base, the first portion and the second portion are respectively disposed to extend from one end of the hollow structure to the other end in the first direction.

Another aspect of the disclosure provides a backlight module, comprising: the wire bunching device as mentioned above; a backplane, provided thereon with a connection structure matching with the base of the wire bunching device, wherein, the wire bunching device is connected with the backplane through the connection structure.

Another aspect of the disclosure provides a display device comprising the backlight module as mentioned above.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

In a display device, there are more wires connected between a power board and a signal board provided in a backlight module. At present, a method for fixing these wires is taking wire materials of a same type in a same wire connecting direction as a group, and attaching the same onto a backplane with an adhesive tape. Such a method has problems as follows: (1) viscosity of the adhesive tape will decrease as time of using the backlight module is prolonged; and heat radiation of a light source of the backlight module will accelerate failure of the adhesive tape, resulting in inability to reliably fix the wires; (2) inconvenience in operation is apt to result in inability for an operator to identify a wire; and (3) appearance is affected.

An embodiment of the present disclosure provides a wire bunching device, comprising a base and a top cap; the top cap and the base being connected with each other to form a hollow structure running through the wire bunching device in a first direction, the hollow structure being used for a wire material to pass through; an inner wall of the hollow structure at least including a first portion formed only by the top cap and a second portion formed only by the base in a first direction, the first portion and the second portion respectively extending from one end of the hollow structure to the other end in the first direction. With the wire bunching device according to the present disclosure, it is possible to effectively restrain the wire materials, and to prevent occurrence of crosstalk and inability for the operator to identify the wires.

It should be noted that, the first direction may be, for example, a direction of a center line of the hollow structure, for example, a straight line, a polygonal line or a curved line.

Figure 1:
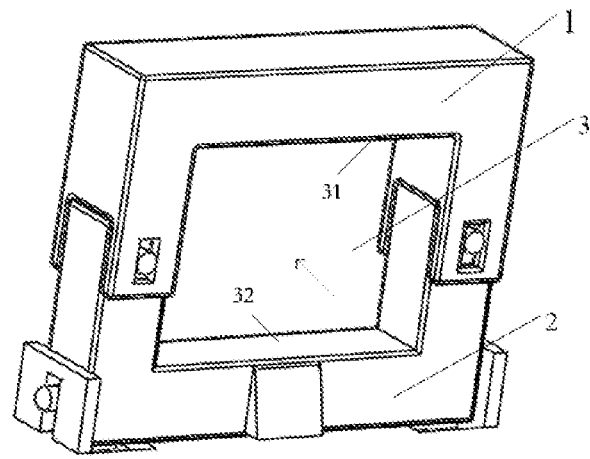
FIG. 1 is a structural schematic diagram of a wire bunching device according to an embodiment of the present disclosure.

FIG. 1 is a structural schematic diagram of a wire bunching device according to an embodiment of the present disclosure. With reference to FIG. 1, the wire bunching device comprises both portions, i.e., a top cap 1 and a base 2. The top cap 1 is connected with the base 2, for example, by engaging with each other. The top cap 1 and the base 2 are connected with each other to form a hollow structure 3 for the wire material to pass through. The hollow structure runs through the wire bunching device, for example, in the first direction (e.g., a direction indicated by an arrow in FIG. 1, for example, the first direction may be substantially the direction of the center line of the hollow structure). With further reference to FIG. 1, for example, an inner wall of the hollow structure 3 includes at least a first portion 31 formed only by the top cap 1 and a second portion 32 formed only by the base 2, the first portion 31 and the second portion 32 respectively extending from one end of the hollow structure 3 to the other end in the first direction. That is to say, neither the top cap 1 nor the base 2 alone forms a closed structure, and the closed hollow structure 3 is formed by connecting the top cap 1 and the base 2 with each other. For example, two protruding columns may be spaced apart on a side of the top cap, for example, the first portion 31 may be a portion of the side of the top cap located between the two protruding columns; correspondingly, two protruding columns are spaced apart on a side of the base, for example, the first portion 32 of the base may be a portion of a side of the base located between the two protruding columns. The two protruding columns of the top cap and the two protruding columns of the base are connected with each other to form the hollow structure. When used, the wire material may be provided between the protruding columns spaced apart of the top cap or the base, and the top cap 1 and the base 2 are, for example, engaged with each other, so as to effectively restrain the wire material within the hollow structure 3. Of course, after the top cap 1 and the base 2 are connected with each other, the wire material may also be passed through the hollow structure 3, so as to fix the wire material. A specific mode for providing the wire material in the hollow structure is not limited in the present disclosure.

It should be noted that, the hollow structure may also be formed, for example, by providing a structure only on the base for the wire material to run through, and the running-through structure has, for example, an opening on one side. The top cap is used, for example, for closing the opening on one side of the running-through structure on which the opening is provided, to form the above-described hollow structure. The opening of the running-through structure allows the wire material to be conveniently placed within the running-through structure of the base. At this time, the top cap plays a role in closing the opening of the running-through structure provided in the base, so that the wire material is restrained within the hollow structure. For example, the hollow structure may also be formed by forming the running-through structure only on the top cap for the wire material to run through, and the running-through structure has, for example, an opening on one side. One side of the running-through structure on which the opening is provided on the top cap is connected with the base, so that the base can close the opening to form the hollow structure. At this time, the base plays a role including closing the opening of the running-through structure provided in the top cap, so as to form a closed hollow structure. A specific mode of forming the hollow structure with the top cap and the base is not limited to the above-described description.

In addition, the hollow structure may be a regular or irregular shape, for example, a rectangle, or a square. For example, the inner wall of the hollow structure in contact with the wire material may be provided as a smoothly transitioned arc-shaped structure, for example, a circle, a fan or an ellipse, etc., to prevent an inner edge of the hollow structure from scratching the wire material, when the wire material is fixed within the hollow structure.

In one embodiment, there is a groove provided in the base of the wire bunching device. For example, an outer side wall of the base of the wire bunching device is provided with a first groove or a side of the base away from the top cap is provided with a second groove. For example, it is also possible to provide the first groove on the outer side wall of the base, and provide the second groove on the side of the base away from the top cap, so as to improve a fixing strength of the wire bunching device with, for example, the backplane. For example, when such a wire bunching device is applied to a liquid crystal backlight module, the backplane in the liquid crystal module may be provided with a structure matching with the first groove and the second groove as described above, so that the wire bunching device can be firmly fixed onto the backplane through the base.

Further, a flange extending in a width direction of the groove may be provided within the groove. For example, a first flange extending in a width direction of the first groove is provided within the first groove; or a second flange extending in a width direction of the second groove is provided within the second groove. Likewise, for example, the backplane of the backlight module may also be provided thereon with a concave portion matching with the above-described flange. By providing the flange within the groove of the base in the width direction of the groove, it is possible to prevent the wire bunching device and the backplane from sliding relative to each other after the former is fixed onto the latter.

Figure 2A:
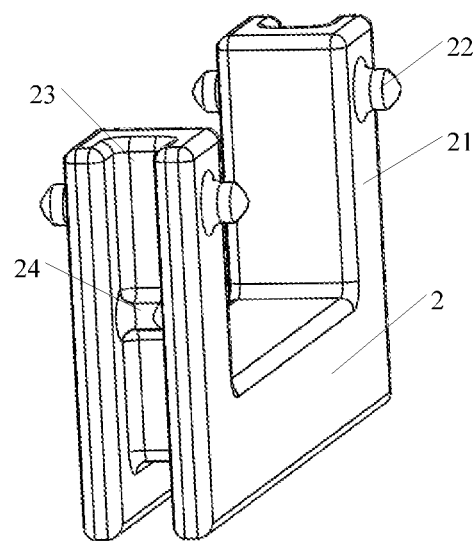
FIG. 2A is a structural schematic diagram of a base of the wire bunching device according to the embodiment of the present disclosure.
Figure 2B:
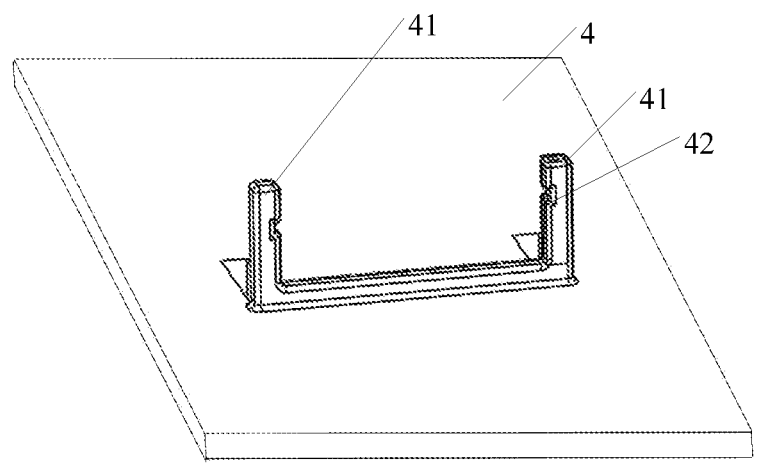
FIG. 2B is a schematic diagram of a backplane having a structure matching with the base shown in FIG. 2A.
Figure 2C:
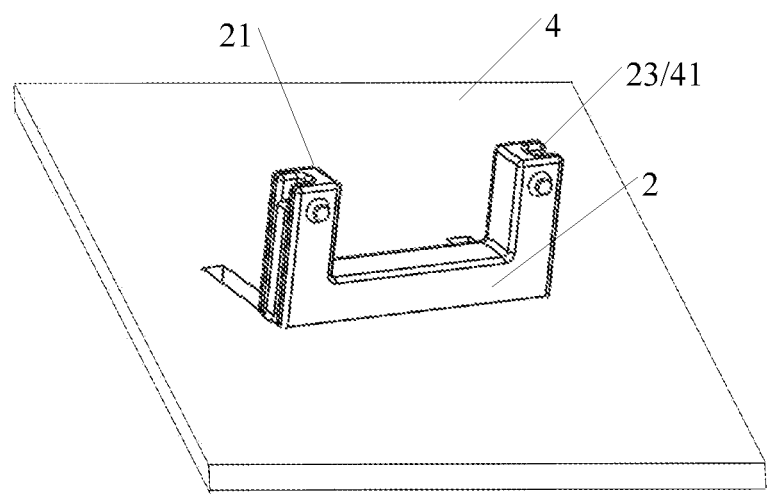
FIG. 2C is a structural schematic diagram of fixing the base of the wire bunching device shown in FIG. 2A onto the backplane shown in FIG. 2B.

FIG. 2A to FIG. 2C respectively show a structure of the base, a structure of the backplane, and a structure in which the base and the backplane are engaged with each other. FIG. 2A is a structural schematic diagram of the base of the wire bunching device according to the embodiment of the present disclosure. FIG. 2B is a schematic diagram of a backplane having a structure matching with the base of the wire bunching device shown in FIG. 2A. FIG. 2C is a structural schematic diagram of fixing the base of the wire bunching device shown in FIG. 2A onto the backplane shown in FIG. 2B; with reference to FIG. 2A, the base 2 includes two protruding columns 21 spaced apart on a side thereof. Outer side walls of the two protruding columns which face away from each other (with respect to two side walls which face each other) are provided with a first groove 23, the first groove 23 extending in a length direction of the protruding column. With further reference to FIG. 2A, a first flange 24 is provided within the first groove 23, for example, in a width direction of the first groove 23.

With reference to FIG. 2B, for example, a main surface of the backplane 4 (a main surface opposite to a main surface on which a light source is provided, that is, a back surface of the backplane) is provided with two protrusion portions 41 corresponding to the two protruding columns 21 of the base. The two protrusion portions 41, for example, protrude from the surface of the backplane 4 toward a direction away from the surface and face each other. In addition, concave portions 42 are provided on sides of the two protrusion portions 41 facing each other. As described above, the protrusion portion 41 matches with the first groove 23 of the base 2, and the concave portion 42 matches with the first flange 24. The so-called "matching with" here refers to a case that the protrusion portion can be snapped into the first groove. For example, a size of the protrusion portion may be slightly smaller than a size of the first groove, or the base is made of plastic by molding, which may have a certain amount of deformation. In addition, after the protrusion portion and the first groove are engaged with each other, certain connection strength is needed. The matching of the concave portion and the first flange is similar thereto, that is, the flange can be snapped into the concave portion, and they have certain connection strength with respect to each other.

With reference to FIG. 2C, for example, the base of the wire bunching device and the backplane are fixed by providing the base 2 between the two protrusion portions 41 of the backplane 4. Specifically, the two protrusion portions 41 of the backplane 1 are respectively embedded into the first groove 23 of the base 2 from both sides, to fix the base 2 between the two protrusion portions 41; further, the first flange 24 within the first groove 23 is snapped into the concave portion 42, to limit relative movement of the base and the backplane. With such an engagement structure, the wire bunching device can be firmly fixed onto the backplane through the base, and can be conveniently disassembled from the backplane.

It should be noted that, the first groove according to the present disclosure may be, for example, a plurality of grooves provided in the side wall, and for example, the plurality of grooves are arranged in parallel to or intersecting with each other. For example, a plurality of flanges may also be provided within each groove. By adjusting the number of grooves, setting an extending direction of the groove and adjusting the number of flanges, it is possible to further improve the fixing effect of the base with, for example, the backplane. In addition, a side of the base away from the protruding column may also be, for example, provided with a second groove, and the second groove is, for example, provided with a second flange, to improve the fixing strength of the base and the backplane. Likewise, it is also possible to further improve the engagement effect of the base with, for example, the backplane, by adjusting the number of grooves, setting the extending direction of the groove and adjusting the number of flanges within the groove.

Figure 3:
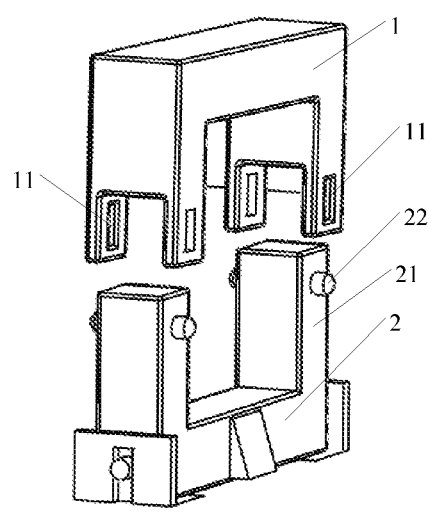
FIG. 3 is a schematic diagram of an engagement structure of a top cap and the base of the wire bunching device according to the embodiment of the present disclosure.

In one embodiment, the top cap and the base are connected by engaging with each other. FIG. 3 is a schematic diagram of an engagement structure of the top cap and the base according to the embodiment of the present disclosure. With reference to FIG. 3, a first side of the base 2 includes two protruding columns 21 spaced apart. For example, the two protruding columns are cuboid structures. For example, the two protruding columns may also be cylindrical or other irregular structures, which, for example, are symmetrically provided on the first side of the base 2. The two protruding columns 21 are respectively provided thereon with snap joints 22. For example, with respect to the protruding column of the cuboid structure, the snap joints 22 are symmetrically provided on two surfaces opposite to each other of the cuboid, to improve stability of the engagement structure. The top cap 1 is provided thereon with a hanging trough 11 corresponding to the above-described snap joint 22. For example, the hanging trough 11 has a shape matching with the snap joint 22. It should be noted that, the snap joint and the hanging trough matching with each other refers to that the snap joint can be snapped into the hanging trough, and has a certain degree of engagement strength. For example, a size of the snap joint may be slightly smaller than that of the hanging trough, so that after the snap joint is snapped into the hanging trough, it is brought into close contact with an inner wall of the hanging trough, to improve the engagement strength; or the hanging trough is formed with plastic by molding, which has elasticity, and after it is engaged with the snap joint, the two can be brought into close contact. For example, as shown in FIG. 3, the snap joint 22 is a protruding small cylinder, and the hanging trough 22 is an elongated open slot. Here, a size of the hanging trough 11 should be such that the snap joint 22 can be ensured to be snapped in, and it is advisable that the size of the hanging trough is slightly larger than that of the snap joint. In this way, not only can the hanging trough 11 and the snap joint 22 be firmly engaged with each other, that is, the snap joint 22 is not easily detached from the hanging trough 11; but also it can be ensured that the hanging trough 11 and the snap joint 22 are conveniently disassembled. Further, it is also possible to provide a clamping hook in the vicinity of the hanging trough of the top cap, so as to hook the snap joint 22, after the snap joint 22 is snapped into the hanging trough 11, to further improve stability of the engagement structure. After the snap joint 22 and the hanging trough 11 are engaged with each other, the two protruding columns 21 of the base 2 provided on the first side, a portion of the base 2 located between the two protruding columns 21 on the first side, and the top cap 1 form the hollow structure. In such a mode of engaging the snap joint and the hanging trough, operation is convenient, and the wire material can be effectively fixed.

For example, a position of the snap joint provided on the base and a position of the hanging trough provided on the top cap may also be, for example, interchangeable. That is, the hanging trough is provided on the protruding column of the base, and the snap joint corresponding to the hanging trough is provided on the top cap.

For example, one end of the two protruding columns of the base away from the first side of the base may also be provided as a slot structure; and correspondingly, one side of the top cap may be provided as a male tab structure corresponding to the slot structure. By inserting and extracting the male tab of the top cap into and out of the slot of the base, connection between the base and the top cap is implemented. For example, the protruding column of the base may also be provided as a male tab structure, and the top cap may be provided as a slot structure corresponding to the male tab structure, so as to implement engagement of the top cap and the base with each other. Such an engagement structure in which the slot and the male tab cooperate with each other can implement rapid connection and separation of the top cap and the base, and further improve the engagement strength.

Figure 4:
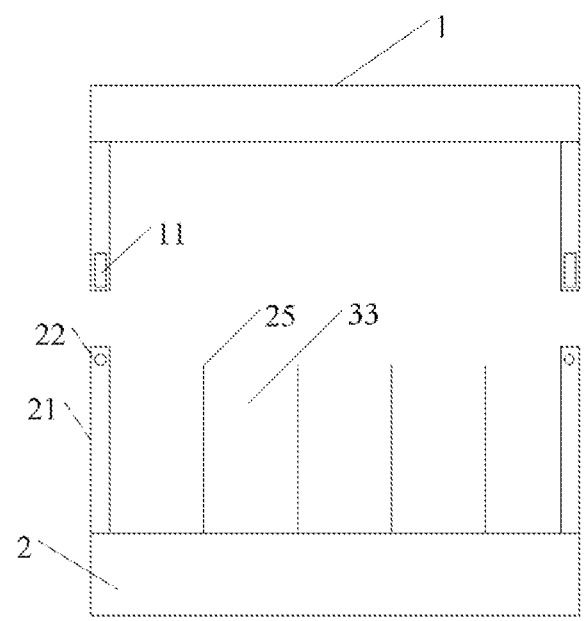
FIG. 4 is a side-view schematic diagram of providing a protruding column and a barrier sheet on a side of the base of the wire bunching device according to the embodiment of the present disclosure.

In one embodiment, for example, one or more barrier sheets may be provided between the two protruding columns. FIG. 4 is a side-view schematic diagram of providing protruding columns and a plurality of barrier sheets on a side of the base of the wire bunching device according to the embodiment of the present disclosure. With reference to FIG. 4, the wire bunching device comprises a top cap 1 and a base 2. A first side of the base 2 is provided with two protruding columns. And for example, the protruding column 21 is the cuboid or other regular or irregular structure as described above. The barrier sheet 25 provided between the protruding columns 21 of both sides is for example, a sheet-like structure (indicated by a straight line in the diagram), for example, planes of the sheet-like structure are directed toward the protruding columns of both sides. For example, the barrier sheet 25 is provided in the above-described first direction. One side of the base 2 is divided, by the protruding columns 21 and the barrier sheets 25, into a plurality of lattices 33 for the wire material to pass through, and these lattices, for example, may be used for providing wire materials of different types or orientations. The top cap 1 has, for example, a corresponding connection structure with only the protruding columns 21 on both sides of the base 2, which is, for example, the engagement structure with each other as described above. That is, the protruding column 21 of the base 2 is provided with the snap joint 22, and the top cap 1 is provided with the hanging trough 11 corresponding to the snap joint 22, to implement engagement and separation of the top cap and the base. After the top cap 1 and the base 2 are connected with each other, the barrier sheet 25 provided between the protruding columns 21 causes a side of the hollow structure 3 close to the base 2 to be divided into a plurality of lattices for the wire material to pass through, and for example, these lattices may be used for providing wire materials of different types or orientations. For example, shapes of the barrier sheet located in a middle portion and spacing distances between one another may also be different, so as to accommodate wire materials of different types or orientations. By restraining wire materials of different types or orientations with different lattices, a fixing effect on wire materials of different types or orientations may be improved, to further avoid wire crosstalk and identification difficulties.

In this embodiment, the above-described barrier sheet 25 may also be, for example, made of a magnetic material, so as to further stabilize current for the line. That is, wire materials within one lattice and wire materials within other lattice are shielded from each other, to further enhance capacity for line to resist disturbance.

Figure 5:
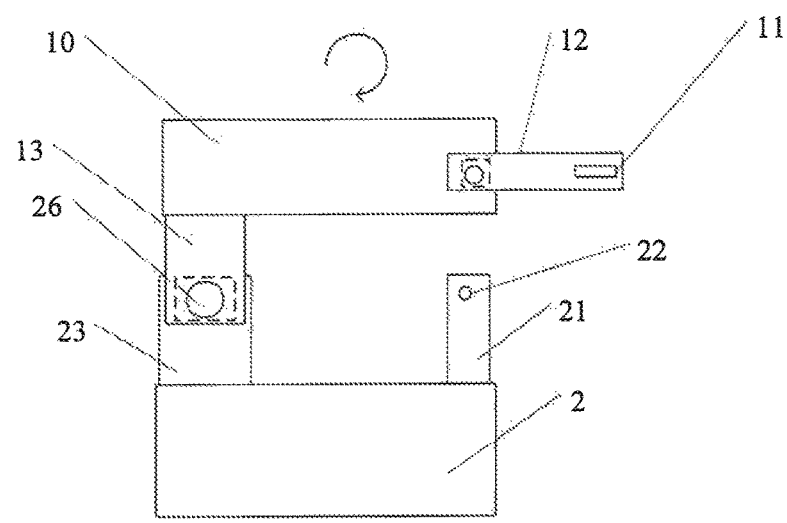
FIG. 5 is a schematic diagram of a connection structure of the base and the top cap in the wire bunching device according to the embodiment of the present disclosure.

In one embodiment, the first side of the base includes two protruding columns spaced apart; one end of the top cap is rotatably connected with one of the protruding columns, and the other end is engaged with the other protruding column. FIG. 5 is a main-view schematic diagram of a type of connection structure of the base and the top cap of the wire bunching device according to the embodiment of the present disclosure. With reference to FIG. 5, the wire bunching device comprises a top cap 1 and a base 2. One side of the base 2 is provided with a protruding column 21 and a protruding column 23 spaced apart. The protruding column 23 is provided thereon with a rotary shaft, and the protruding column 21 is provided thereon with a snap joint 22. For example, the snap joint 21 may be a small cylinder as described above. The top cap 1 includes a main body 10, one end of the main body 10 is rotatably (e.g., pivotally) connected with a first connection portion 12. An outer side of the first connection portion 12 is provided with a hanging trough 11. The top cap 1 further includes a second connection portion 13 which is connected (fixedly connected or rotatably connected) with the other end of the main body 10. The second connection portion 13 may be, for example, bushed around the rotary shaft of the protruding column 23, so that the top cap 1 can be rotated around the rotary shaft. A connection mode of a portion enclosed by a dotted line in FIG. 5 may be, for example, a rotatably connection mode; or integral formation of the top cap and the base with plastic by molding, with rotatably connection at the protruding column on one side, and engagement at the protruding column on the other side.

For example, closing operation of the top cap is that after the top cap is rotated in place in a clockwise direction in the diagram (i.e., a direction indicated by an arrow in the diagram), further, the first connection portion 12 is rotated in the clockwise direction, so as to engage, for example, the hanging trough 11 provided in the first connection portion 12 with the snap joint 22 of the protruding column 21. For example, separation operation of the top cap is that, firstly, the hanging trough 11 is separated from the snap joint 22, and then, when the top cap 1 is rotated in a counterclockwise direction in the diagram, the hollow structure can be opened, so as to form an opening on one side of the hollow structure away from the base. The wire material can be placed within the hollow structure through the opening, and then, the above-described closing operation of the top cap is repeated, so as to restrain the wire material within the hollow structure. In this embodiment, for engagement of the top cap with one of the protruding columns of the base, various engagement modes as described above may be used, for example. With the structure in which the top cap and one end of the base are rotatably connected, and the top cap and the other end are engaged with each other, on the one hand, it is possible to improve working efficiency, i.e., to implement rapid engagement of the top cap and the base; and on the other hand, it is also possible to prevent the top cap from being lost.

It should be noted that, with respect to the above-described structure, the protruding column and the barrier sheet may also be provided on the first side of the base as described above, so as to divide the hollow structure into a plurality of lattices for the wire material to pass through; for example, a material of the barrier sheet may be further limited as a magnetic material. The previous description may be referred to.

Figure 9:
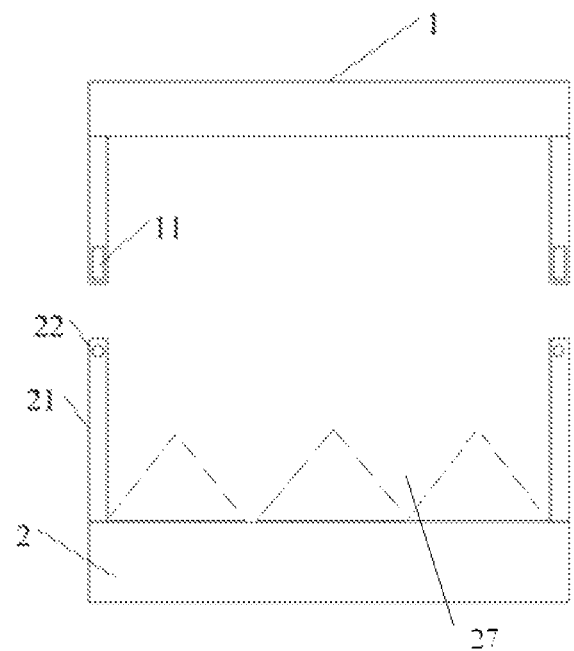
FIG. 9 is a side-view schematic diagram of providing a plurality of positioning grooves on an inner wall of a hollow structure of the wire bunching device according to the embodiment of the present discloser.

In one embodiment, the inner wall of the hollow structure may be provided with a plurality of positioning grooves 27, so as to better position and fix the wire material, as shown in FIG. 9. For example, the positioning groove 27 may be formed by protruding the inner wall of the hollow structure, or may be formed by recessing the inner wall of the hollow structure. The positioning groove may be set to a variety of shapes. For example, the positioning groove may be a U-shaped groove or a V-shaped groove or a positioning groove of other shapes. For example, sizes and shapes of these positioning grooves may be the same or different from each other. For example, if the backlight module includes lines of two types and orientations, two different types of positioning grooves may be set for the two types and orientations of lines. On the one hand, different types of positioning groove per se can play a role in identifying the line. That is to say, after different wire materials are fixed into different positioning grooves, an operator is able to clearly identify different wire materials, which provides a facility for follow-up line maintenance of the line, replacement of the wire materials, and other operations; on the other hand, by pertinently providing the structure of the positioning groove, the wire materials of different types and orientations may be fixed more effectively, to further avoid detachment and displacement of the wire material.

For example, corresponding to the above-described positioning groove, a wire locking mechanism capable of locking tight the wire material may further be provided on the inner wall of the hollow structure. For example, the wire locking mechanism may be a string or a leather girdle, or other long strip-like structure. For example, one end of the wire locking mechanism may be fixed onto the inner wall of the hollow structure. After the wire material is provided within the positioning groove, the other end of the wire locking mechanism may be dragged so that the long strip-like wire locking mechanism compresses tightly the wire material within the positioning groove from above the wire material, and the other end of the wire locking mechanism is fixed. For example, the other end of the wire locking mechanism is provided with a hook, and the inner wall of the hollow structure is provided with a hanging ring corresponding to the hook. Further, it is also possible to independently provide a wire locking mechanism for each positioning groove, so as to further improve the fixing effect of the wire material. By providing the wire locking mechanism on the inner wall of the hollow structure, the wire material placed in the positioning groove may be further fixed, so as to better avoid detachment and displacement of the wire material.

According to another aspect of the present disclosure, there is provided a backlight module comprising the above-described wire bunching device, and the backlight module further comprising a backplane, the backplane being provided thereon with a connection structure matching with the base of the wire bunching device.

Figure 6:
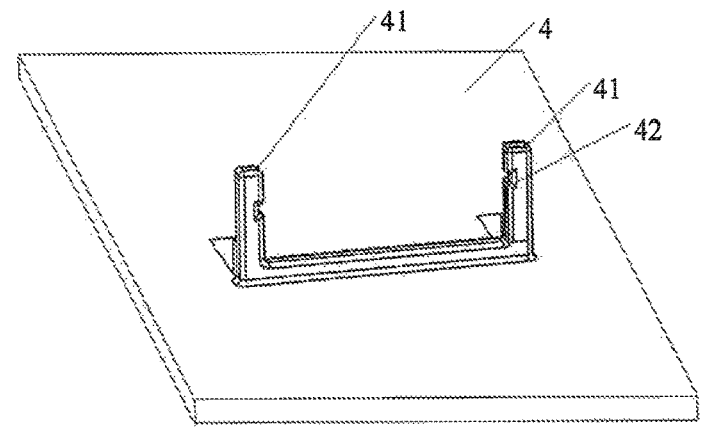
FIG. 6 is a structural schematic diagram of the backplane according to the embodiment of the present disclosure.

For example, in a backlight module 7 according to one embodiment, a light source is provided on a side of the backplane, for example, on a main surface of the backplane. With reference to FIG. 6, the connection structure of the backplane matching with the wire bunching device is: two protrusion portions 41 protruding from a main surface of the backplane 4 opposite to a side on which the light source is provided (i.e., a back surface of the backplane) to a direction away from the main surface, and facing each other, and sides of the two protrusion portions 41 facing each other are respectively provided with a concave portion 42. The two protrusion portions 41 correspond to, for example, the two first grooves 23 as described above, and the concave portion 42 corresponds to the first flange 24. With reference to the previous drawings and description, the wire bunching device and the backplane are fixed by: providing the wire bunching device between the two protrusion portions 41 of the backplane 4 through the base 2, and respectively embedding the two protrusion portions 41 from both sides into the first groove 23 corresponding to the base, and embedding the first flange 24 within the first groove 23 into the concave portion 42 provided in the protrusion portion 41 of the backplane. In the backlight module, with such an engagement structure for the backplane and the base, the wire bunching device can be firmly fixed onto the backplane through the base.

Figure 7:
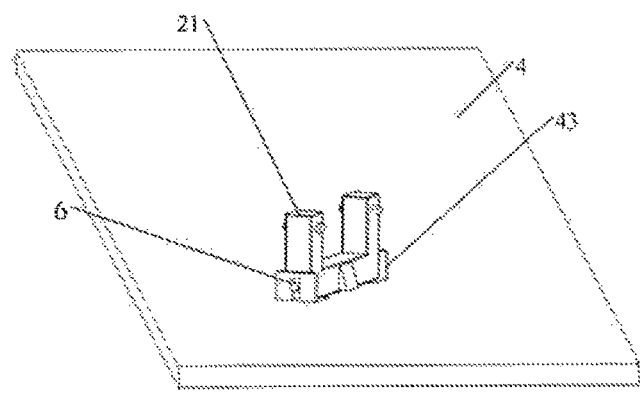
FIG. 7 is a schematic diagram of another mode of fixing the wire bunching device and the backplane according to the embodiment of the present disclosure.

FIG. 7 is a schematic diagram of another mode of fixing the wire bunching device and the backplane according to the embodiment of the present disclosure. With reference to FIG. 7, the wire bunching device and the backplane 4 are also fixed by, for example: providing two fixing plates 43 on the backplane 4, and providing a groove running through the fixing plate on the fixing plate 43; providing the two fixing plates facing each other on the main surface of the backplane opposite to the side on which the light source is provided (i.e., the back surface of the backplane). Correspondingly, an engagement structure is provided on one side of the base 2 of the wire bunching device, and the engagement structure corresponds to, for example, the above-described groove. After the base 2 of the wire bunching device is placed between the two fixing plates 43, the engagement structure of the base passes through the groove, to achieve an effect of fixing the base. For example, the engagement structure of the base may be bolts 6 protruding outwardly provided on sides facing away from each other of the protruding column of the above-described wire bunching device, for example, the sides facing away from each other of the protruding column may include bolt holes into which the bolts 6 may be screwed. The two bolts 6 can respectively pass through the grooves on the two fixing plates, to achieve a purpose of engaging the base and the backplane with each other. For example, it is also possible to tighten with a screw nut at an outer side of the bolt 6, to further improve the engaging effect.

Figure 8:
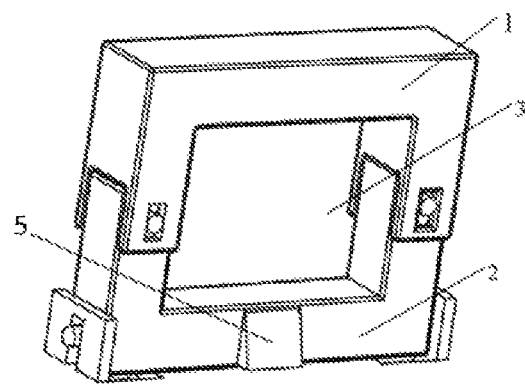
FIG. 8 is a structural schematic diagram of a base provided with an auxiliary support wing portion in the wire bunching device according to the embodiment of the present disclosure.

Further, for example, a support wing portion may also be provided on the base. FIG. 8 is a structural schematic diagram of a base provided with an auxiliary support wing portion in the wire bunching device according to the embodiment of the present disclosure. With reference to FIG. 8, the base 2 of the wire bunching device is also provided thereon with the auxiliary support wing portion 5. For example, the auxiliary support wing portion 5 is provided on at least one side of the two sides of the base in the first direction. A bottom of the auxiliary support wing portion 5 can withstand the backplane after installation. The auxiliary support wing portion 5 can further improve the fixing effect of the base of the wire bunching device on the backplane.

The connection structure of the backplane 4 and the base 2 of the wire bunching device is not limited to the above description.

The description of the specific connection structure of the backplane and the base according to the present disclosure shall not be construed as limitation to the present disclosure.

According to a further aspect of the present disclosure, there is provided a display device comprising the above-described backlight module 7.

The respective embodiments of the present disclosure have at least one of advantages as follows:

(1) The wire bunching device according to the present disclosure, by forming the hollow structure through cooperation of the top cap and the base, can effectively restrain the wire material within the hollow structure, and prevent occurrence of line identification confusion.

(2) The wire bunching device according to the present disclosure, by arranging the groove and the flange on the base, can implement reliable connection between the wire bunching device and the backplane.

(3) The wire bunching device according to the present disclosure, by connecting the top cap and the base with the engagement structure of the protruding column and the hanging trough, has a simple structure, and enables more convenient operation.

(4) The wire bunching device according to the present disclosure, by arranging the base and the top cap to have one end subjected to engagement connection, and the other end subjected to rotatably connection or integral formation, can prevent loss of parts, and at the same time, improve assembling efficiency.

(5) The wire bunching device according to the present disclosure, by dividing the hollow structure into a plurality of lattices with the magnetic material and placement of the wire materials of different types and orientations into different lattices, further improves an anti-crosstalk effect of the line; and further prevents occurrence of identification confusion.

In this text, terms such as "first" and "second" are only used for differentiating one entity or operation from another entity or operation without requiring or implying that these entities or operations have any such actual relationship or sequence. Terms "comprise", "include" or other variants are open-ended expression, which does not exclude processes, methods and articles included therein, and presence of other elements. It should be explained that directional or positional relationships shown by terms such as "upper", "lower" are directional or positional relationships shown as in the drawings, which only means to facilitate description of the present disclosure and simplify the description, but do not indicate or imply that the devices or components must have specific directions, or be constructed or operated in the specific directions, and are not limitative of the present disclosure. Unless expressly stipulated or defined, terms "mounted", "connected" and "linked" should be broadly understood, for example, they may be fixedly connected, detachably connected, or integrally connected; may be mechanically connected or electrically connected; or may be directly connected, indirectly connected by a medium, or internally communicated between two components. For those ordinarily skilled in the art, the specific meanings of the terms in the present disclosure can be understood according to specific conditions.

The foregoing embodiments merely are exemplary embodiments of the present disclosure, and not intended to define the scope of the present disclosure, and the scope of the present disclosure is determined by the appended claims.

The present application claims priority of Chinese Patent Application No. 201620437785.3 filed on May 13, 2016, the present disclosure of which is incorporated herein by reference in its entirety as part of the present application.

The invention claimed is:

1. A wire bunching device, comprising:
 a base; and
 a top cap connected with the base to form a hollow structure running through the wire bunching device in a first direction; wherein
 the hollow structure is used for a wire material to pass through,
 an inner wall of the hollow structure at least comprises a first portion formed by the top cap and a second portion formed by the base,
 the first portion and the second portion are respectively disposed to extend from one end of the hollow structure to the other end in the first direction,
 wherein the base is provided thereon with an engagement structure, and the engagement structure is configured to match connection with a connection structure of a backplane, and
 wherein the engagement structure is a groove, and the groove is provided in at least one of an outer side wall of the base and a side of the base away from the top cap.

2. The wire bunching device according to claim 1, wherein, the groove is provided therein with a flange extending in a width direction of the groove.

3. The wire bunching device according to claim 1, wherein, the top cap is detachably connected with the base.

4. The wire bunching device according to claim 3, wherein, the top cap and the base are connected by engagement with each other.

5. The wire bunching device according to claim 4, wherein, a first side of the base includes two protruding columns spaced apart, and the two protruding columns are provided thereon with snap joints; the top cap is provided thereon with hanging troughs corresponding to the snap joints; the two protruding columns, a portion of the base located between the two protruding columns on the first side, and the top cap form the hollow structure under the hanging troughs and the snap joints being engaged with each other.

6. The wire bunching device according to claim 1, wherein, the first side of the base includes two protruding columns spaced apart; a first end of the top cap is rotatably connected with one protruding column of the two protruding columns spaced apart, and a second end of the top cap is connected with the other protruding column of the two protruding columns spaced apart in a mode of engaging with each other; the two protruding columns spaced apart, the portion of the base located between the two protruding columns on the first side, and the top cap form the hollow structure under the second end being connected with the other protruding column in the mode of engaging with each other.

7. The wire bunching device according to claim 6, wherein, one of the protruding columns of the base is provided with a rotary shaft, the first end is connected with the protruding column through the rotary shaft; and the second end is rotated around the rotary shaft, so as to be close to or away from the other protruding column of the base.

8. The wire bunching device according to claim 7, wherein, a portion of the first side of the base located between the two protruding columns is provided with one or more barrier sheets; and the barrier sheets are configured to divide the hollow structure into a plurality of lattices for the wire material to pass through.

9. The wire bunching device according to claim 8, wherein, the barrier sheet is made of a magnetic material.

10. The wire bunching device according to claim 1, wherein, the inner wall of the hollow structure is provided with a plurality of positioning grooves.

11. The wire bunching device according to claim 10, wherein, the positioning groove is a U-shaped groove or a V-shaped groove.

12. A backlight module, comprising:
 a wire bunching device;
 a backplane, provided thereon with a connection structure matching with a base of the wire bunching device and perpendicular to a plane where the backplane is located,
 wherein the wire bunching device is connected with the backplane through the connection structure,
 wherein the connection structure is an engagement structure, the engagement structure includes two protrusion portions and a concave portion provided on the protrusion portions; the two protrusion portions are provided facing each other on a main surface of the backplane, and protruding in a direction away from the main surface, and the concave portion is provided on sides facing each other of the two protrusion portions.

13. The backlight module according to claim 12, wherein, a first side of the base is provided with two protruding columns spaced apart, outer side walls of the two protruding columns which face away from each other are provided with a groove, and the groove is provided therein with a flange extending in a width direction of the groove;
 the wire bunching device is provided between the two protrusion portions, the two protrusion portions are respectively embedded into the groove from both sides of the base, and the concave portion is matched and engaged with the flange.

14. The backlight module according to claim 12, wherein, at least one side of the base in the first direction includes an auxiliary support wing portion.

15. A backlight module, comprising;
 a wire bunching device;
 a backplane, provided thereon with a connection structure matching with a base of the wire bunching device and perpendicular to a plane where the backplane is located,
 wherein, the wire bunching device is connected with the backplane through the connected structure,
 wherein the connection structure is an engagement structure the engagement structure of the backplane includes two fixing plates, and a groove provided in the fixing plate which runs through the fixing plate; the two fixing plates are provided facing each other on the main surface of the backplane; a side of the base includes an engagement corresponding to the groove; and after the base is provided between the fixing plates, the engagement structure passes through the groove, to implement engagement of the base and the backplane.

16. The backlight module according to claim 15, wherein at least one side of the base in the first direction includes an auxiliary support wing portion.

* * * * *